United States Patent [19]

Tsuchikawa et al.

[11] Patent Number: 4,516,030

[45] Date of Patent: May 7, 1985

[54] SCANNING ELECTRON BEAM EXPOSURE SYSTEM

[75] Inventors: Haruo Tsuchikawa, Yokohama; Junichi Kai, Tokyo, both of Japan

[73] Assignee: Fujitsu Limited, Kawasaki, Japan

[21] Appl. No.: 423,644

[22] Filed: Sep. 27, 1982

[30] Foreign Application Priority Data

Sep. 26, 1981 [JP] Japan .................. 56-152661

[51] Int. Cl.³ .................. A61K 27/02; B65G 65/30; H01J 37/00
[52] U.S. Cl. .................. 250/492.2; 219/121 EL
[58] Field of Search .............. 250/441.1, 442.1, 492.2, 250/492.3; 219/121 EL, 121 EN, 121 EP

[56] References Cited

U.S. PATENT DOCUMENTS

| 3,430,029 | 2/1969 | Hinrichs | 219/121 EL |
| 3,612,815 | 10/1971 | Henrichs | 219/121 EL |
| 3,756,435 | 9/1973 | Steigerwald | 219/121 EN |
| 4,013,261 | 3/1977 | Steigerwald et al. | 219/121 EL |
| 4,353,160 | 10/1982 | Armini et al. | 250/492.2 |

Primary Examiner—Bruce C. Anderson
Attorney, Agent, or Firm—Staas & Halsey

[57] ABSTRACT

A scanning electron beam exposure system which comprises a main chamber (1), a subchamber (8), vacuum pumps (12, 13) and valves (10, 11, 14~16). The projection of an electron beam onto a workpiece within the main chamber is inhibited while an electrical or mechanical noise generated by at least one of the valves substantially exists.

3 Claims, 2 Drawing Figures

SCANNING ELECTRON BEAM EXPOSURE SYSTEM

BACKGROUND OF THE INVENTION

1. Field of the Invention

The present invention relates to a scanning electron beam exposure system used in the manufacture of semiconductor devices.

2. Description of the Prior Art

In the manufacture of semiconductor devices, conventional optical lithographic technologies have been used for producing circuit patterns on chips. The minimum line width is, in this case, about 2 to 3 $\mu$m. However, in order to make large-scale integration circuits more complex, the minimum line width must be in the sub-micrometer region. For this purpose, scanning electron beam exposure systems have been developed.

In the optical lithographic technologies, a 10× reticle is manufactured. The reticle is then projected onto a master mask demagnified 10 times. In this case, a large number of the same chip patterns of the reticle are repeatedly projected onto the master mask so as to complete the master mask. However, in the scanning electron beam exposure technologies, the chip patterns are directly depicted on a master mask or a wafer without the manufacture of a 10× reticle. Therefore, the turn-around time is reduced, the manufacturing costs are reduced, and the accuracy of the patterns is improved, as compared with conventional optical technologies.

In the electron beam exposure system, since the deflection region of an electron beam is very small as compared with the size of a mask or a wafer, a workstage for carrying the mask or wafer must be moved so as to expose the entire mask or wafer. In the scanning electron beam exposure technologies, there are two methods for moving a workstage; a continuously moving method and a step-and-repeat method.

In the continuously moving method, the electron beam is raster-scanned in one direction, such as the X-direction, and the workstage moves in the other direction, such as the Y-direction, at a definite speed. In this method, the exposure time has no relation to the complexity of the patterns, and, accordingly, there is a large effect in the case of complex patterns. Note that, in the optical depiction of a reticle, the exposure time is dependent upon the complexity of the patterns.

In the step-and-repeat method, the pattern is exposed by deflecting the electron beam over a square field, such as one chip, with the workstage stationary. After exposure, the workstage is moved to a new location, and pattern exposure is repeated. This process continues until the entire mask or wafer is covered. The two scanning or writing methods for one chip are a raster-scanning method and a vector-scanning method. In the raster-scanning method, the electron beam is scanned over the entire chip area and is turned on and off according to the desired pattern. In the vector-scanning method, the electron beam addresses only the pattern regions requiring exposure. Usually, in this case, the pattern is decomposed into a series of simple shapes, such as rectangles and parallelograms. In the vector-scanning method, the exposure time becomes longer when the pattern is more complex. However, there is the possibility of a higher exposure speed than the exposure speed of the raster-scanning method.

The exposure time for one 3-inch (77 mm) mask or wafer according to the scanning electron beam system is about 5 to 40 minutes.

In order to more effectively progress the mass production of semiconductor devices, it has been proposed to add an automatic exchanging and loading function. As a result, when the exposure operation for one mask or wafer is completed, the operation for loading the next mask or wafer is automatically performed, and, after that, the operation for exchanging the exposed mask or wafer for an unexposed mask or wafer is also automatically performed. Therefore, it is possible to exclude from the exposure operation the harmful effects of mechanical vibration or impact or electrical or magnetic noise due to the opening or closing of a vacuum valve, the motion of a holder, or the like.

SUMMARY OF THE INVENTION

It is, therefore, a principal object of the present invention to provide a scanning electron beam exposure system having a higher throughput than such conventional systems.

According to the present invention, there is provided a scanning electron beam exposure system comprising: a main chamber for projecting an electron beam onto a workpiece placed therein; a subchamber connected to the main chamber via a first gate valve; vacuum pump means, connected to the subchamber via a second gate valve, for decreasing the pressure in the subchamber; leaking means, connected to the subchamber via a third gate valve, for increasing the pressure in the subchamber; exposure control means for controlling the projection of the electron beam onto the workpiece, projecting the electron beam while the pressure in the subchamber is increasing or decreasing; loading and exchanging control means for controlling operations of the first, second, and third gate valves; and central control means for controlling the exposure control means and the loading and exchanging control means, the central control means providing the exposure control means with a command to inhibit the projection of the electron beam to the workpiece while an electrical or mechanical noise generated by at least one of the first, second, and third gate valves substantially exists.

The present invention will now be more clearly understood from the description as set forth below with reference to the accompanying drawings.

DESCRIPTION OF THE PREFERRED EMBODIMENT

Figure 1:
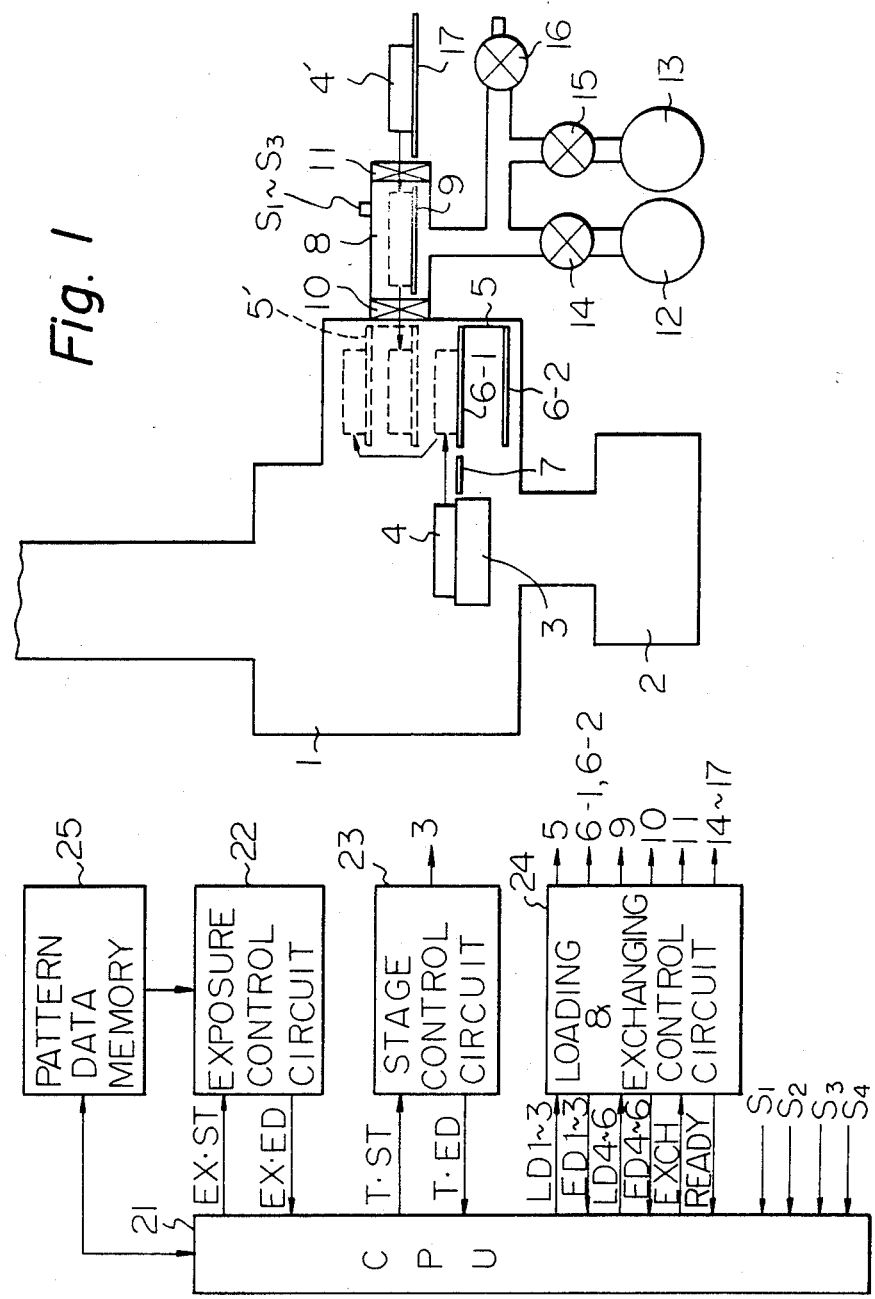
FIG. 1 is a block diagram of an embodiment of the scanning electron beam exposure system according to the present invention.

In FIG. 1, reference numeral 1 designates a main chamber which usually maintains a high vacuum due to an exhaust device 2. Reference numeral 3 designates an XY workstage on which a holder 4 is mounted. This holder 4 accommodates a mask or a wafer. Reference numeral 5 designates an elevator having two shelves 6-1 and 6-2, each shelf including a holder-leading mechanism, such as a belt. The elevator 5 is used for exchanging holders. Reference numeral 7 also designates a holder-leading mechanism.

Reference numeral 8 designates a subchamber in which a holder-carrying mechanism 9 is arranged. The subchamber 8 is partitioned by two valves 10 and 11.

Reference numerals 12 and 13 designate a high-vacuum pump and a low-vacuum pump, respectively, which are connected to the subchamber 8 via valves 14 and 15, respectively. Reference numeral 16 designates a leak valve.

Reference numeral 17 designates a holder-carrying mechanism on which another holder 4' is mounted.

The control means of the scanning electron beam exposure system will now be explained. A central processing unit (CPU) 21 controls the entire system. An exposure control circuit 22 receives an exposure start command EX.ST from the CPU 21 and transmits an exposure end signal EX.ED when the exposure operation is ended. In the case of the step-and-repeat method, the exposure control circuit 22 generates such an exposure end signal EX.ED when the exposure operation for one chip is ended. On the other hand, in the case of the continuously moving method, the exposure control circuit 22 generates such an exposure end signal EX.ED when the exposure operation for one scanning line is ended.

A stage control circuit 23 controls the driving of the XY stage 3. In the case of the step-and-repeat method, every time the CPU 21 receives an exposure end signal EX.ED, the CPU 21 transmits a stage motion command T ST to the stage control circuit 23, which causes the stage 3 to be moved to a new location, and, after that, the circuit 23 generates a stage motion end signal T ED to the CPU 21. On the other hand, in the case of the continuously moving method, the operation of the exposure control circuit 22 is synchronized with the operation of the stage control circuit 23.

A loading and exchanging control circuit 24 is used for loading or unloading and exchanging holders, each holder including one mask or wafer. In more detail, the control circuit 24 controls the elevator 5, the holder-leading mechanisms included in the shelves 6-1 and 6-2, the holder-carrying mechanism 9, the valves 10, 11, 14, 15, and 16, and the holder-carrying mechanism 17.

Reference numeral 25 designates a pattern data memory 25 which supplies pattern data to the exposure control circuit 22.

According to the present invention, the CPU 21 causes the exposure control circuit 22, the stage control circuit 23, and the loading and exchanging control circuit 24 to operate in parallel. In this case, control is performed so as to exclude from the exposure operation the harmful effects of vibration or impact, or electrical or magnetic noise due to the opening or closing of a vacuum valve, the motion of a holder, or the like.

The unloading operation of a holder of the subchamber 8 will now be explained with reference to FIG. 2. In this case, it is assumed that an exposed holder is located on the holder-carrying mechanism 9 and that the subchamber 8 has a high vacuum.

Figure 2:
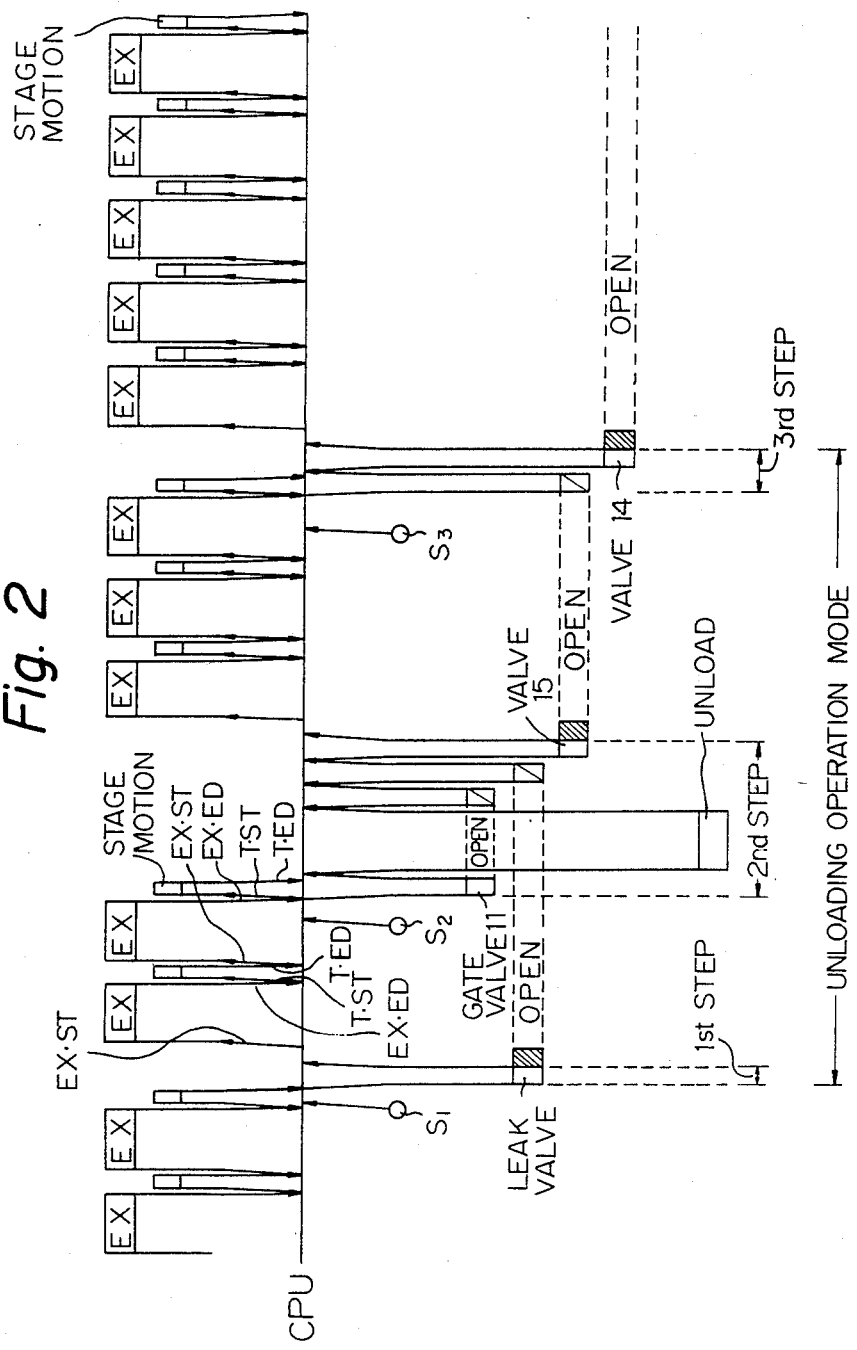
FIG. 2 is a timing diagram of the operation of the system of FIG. 1.

In FIG. 2, a box having no oblique line represents the opening operation of a valve while a box having an oblique line represents the closing operation of a valve. In addition, a shaded box represents an interruption-maintaining time during which no operation is performed.

In the first step, according to a program, the CPU 21 detects the holder within the subchamber 8 with a detector $S_1$. Then the CPU 21 stops the exposure operation and, in turn, transmits an unload operation command LD1 to the loading and exchanging control circuit 24 to start the unloading operation. As a result, the control circuit 24 causes the leak valve 16 to open so that the pressure within the subchamber 8 increases, and the control circuit 24 generates an operation end signal ED1 to the CPU 21.

Next, after a predetermined time has passed, the CPU 21 transmits an exposure start command EX.ST to the exposure control circuit 22 so as to restart the exposure operation.

In the second step, the CPU 21 receives a detection signal from a detector $S_2$ which determines whether or not the pressure within the subchamber 8 is above a predetermined value. Then the CPU 21 stops the exposure operation and, in turn, transmits an unload operation command LD2 to the loading and exchanging control circuit 24. As a result, the control circuit 24 causes the gate valve 11 to open. Then the holder is moved from the holder-carrying mechanism 9 to the holder-carrying mechanism 17. After that, the control circuit 24 causes the gate valve 11 and the leak valve 16 to close. In addition, the control circuit 24 causes the valve 15 to open so that the pressure of the subchamber 8 is decreased to a low vacuum, and the control circuit 24 generates an operation end signal ED2 to the CPU 21.

Next, after a predetermined time has passed, the CPU 21 transmits an exposure start command EX.ST to the exposure control circuit 22 so as to restart the exposure operation.

In the third step, the CPU 21 receives a detection signal from a detector $S_3$ which determines whether or not the pressure within the subchamber 8 is below a predetermined valve. Then the CPU 21 stops the exposure operation and, in turn, transmits an unload operation command LD3 to the loading and exchanging control circuit 24. As a result, the control circuit 24 causes the valve 15 to close and the valve 14 to open so that the pressure of the subchamber 8 is decreased to a high vacuum. Then the control circuit 24 generates an operation end signal ED3 to the CPU 21.

Next, after a predetermined time has passed, the CPU 21 transmits an exposure start command EX.ST to the exposure control circuit 22 so as to restart the exposure operation. Thus, the unloading operation is completed.

The loading operation of a holder of the subchamber 8 is performed in the same way as the above-mentioned unloading operation. In the loading operation, the CPU 21 transmits a load operation command LD4 through LD6 to the loading and exchanging control circuit 24, which, in turn, generates an operation end signal ED4 through ED6.

After the exposure operation for the entire mask or wafer of the holder 4 is completed, the CPU 21 transmits an exchanging operation command EXCH to the loading and exchanging control circuit 24, which exchanges the holder 4 of the main chamber 1 for the holder 4' of the subchamber 8.

First, the holder 4 is moved from the stage 3 to the upper shelf 6-1 of the elevator 5 by the holder-leading mechanism 7. Then the elevator 5 is lifted up, as illustrated by reference numeral 5'. Next, the gate valve 10 is opened, and the holder 4', which is located on the holder-carrying mechanism 9, is then moved to the lower shelf 6-2 of the elevator 5. After that, the elevator 5 is lifted down to an intermediate position. Subsequently, the holder 4 is moved from the upper shelf 6-1 to the holder-carrying mechanism 9 of the subchamber 8 while the holder 4' is moved from the lower shelf 6-2 to the stage 3. Then the gate valve 10 is closed. Thus, the exchanging operation is completed, and, accordingly, the control circuit 24 transmits a ready completion signal READY to the CPU 21, which, in turn, causes the exposure control circuit 22 to perform the exposure operation upon the mask or wafer of the holder 4'.

In the above-mentioned embodiment, the step-and-repeat method is used. However, since the exposure for one scanning line of the continuously moving method corresponds to the exposure for one chip of the step-and-repeat method, a similar operation can be performed in the scanning electron beam exposure system using the continuously moving method.

Further, in the above-mentioned embodiment, the control for the loading or unloading operation is performed mainly on the side of the CPU 21, however, such control can be performed mainly on the side of the loading and exchanging control circuit 24, so as to reduce the load on the CPU 21.

As explained above, according to the present invention, since the exposure operation and the loading (or unloading) operation are performed in parallel, the throughput of the scanning electron beam exposure system is improved. Simultaneously, control is performed so as to exclude from the exposure operation the harmful effects of vibration, impact, noise, or the like due to the opening and closing of a vacuum valve, the motion of a holder, or the like.

We claim:

1. An electron beam exposure system, for exposing a workpiece and for receiving exposure interrupt signals, comprising:
   a main chamber for projecting an electron beam onto the workpiece placed therein;
   a first gate valve operatively connected to said main chamber;
   a subchamber operatively connected to said first gate valve;
   a second gate valve operatively connected to said subchamber;
   vacuum pump means, operatively connected to said second gate valve, for decreasing the pressure in said subchamber;
   a third gate valve operatively connected to said subchamber;
   leaking means, operatively connected to said third gate valve, for increasing the pressure in said subchamber;
   exposure control means, operatively connected to said subchamber, for controlling the projection of said electron beam onto the workpiece while the pressure in said subchamber is increasing or decreasing;
   loading and exchanging control means, operatively connected to said subchamber, for controlling operations of said first, second, and third gate valves; and
   central control means, operatively connected to said exposure control means and said loading and exchanging control means, for providing exposure start and exposure end signals to said exposure control means, while receiving the exposure interrupt request signals, before the opening and closing of at least one of said first, second, and third gate valves, for controlling said exposure control means, and for providing valve open and close permitting signals to said loading and exchanging control means to control said loading and exchanging control means, said central control means providing said exposure control means with a command to inhibit the projection of the electron beam onto the workpiece when noise generated by at least one of said first, second, and third gate valves substantially exists.

2. A system as set forth in claim 1, wherein the exposure control means comprises means for exposing the workpiece by a continuously moving method.

3. A system as set forth in claim 1, wherein the exposure control means comprises means for exposing the workpiece by a step-and-repeat method.

* * * * *

UNITED STATES PATENT AND TRADEMARK OFFICE
CERTIFICATE OF CORRECTION

PATENT NO. : 4,516,030
DATED : MAY 7, 1985
INVENTOR(S) : HARUO TSUCHIKAWA ET AL.

It is certified that error appears in the above-identified patent and that said Letters Patent is hereby corrected as shown below:

```
Col. 1, line 34, "works-" should be --work---;
        line 35, "tage"   should be --stage--.

Col. 3, line 29, "T ST"   should be --T·ST--;
        line 31, "T ED"   should be --T·ED--.

Col. 4, line 8,  "EX.ST"  should be --EX·ST--;
        line 29, "EX.ST"  should be --EX·ST--;
        line 34, "valve"  should be --value--;
        line 43, EX.ST"   should be --EX·ST--.
```

Signed and Sealed this

Seventeenth Day of September 1985

[SEAL]

Attest:

Attesting Officer

DONALD J. QUIGG

*Commissioner of Patents and Trademarks—Designate*